United States Patent
Jung

(10) Patent No.: US 7,705,656 B2
(45) Date of Patent: Apr. 27, 2010

(54) LEAKAGE CURRENT DETECTION CIRCUIT AND LEAKAGE CURRENT COMPARISON CIRCUIT

(75) Inventor: Gun-Ok Jung, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 694 days.

(21) Appl. No.: 11/481,275

(22) Filed: Jul. 5, 2006

(65) Prior Publication Data

US 2007/0025030 A1 Feb. 1, 2007

(30) Foreign Application Priority Data

Jul. 8, 2005 (KR) .................... 10-2005-0061782

(51) Int. Cl.
*H03K 17/687* (2006.01)
(52) U.S. Cl. ..................... 327/427; 257/524
(58) Field of Classification Search ............. 327/427; 257/524
See application file for complete search history.

(56) References Cited

U.S. PATENT DOCUMENTS 6,985,027 B2 * 1/2006 Yabe ..................... 327/541

2006/0170461 A1 * 8/2006 Bhattacharya et al. ........ 327/65
2006/0186946 A1 * 8/2006 Hughes ....................... 327/427

FOREIGN PATENT DOCUMENTS

| JP | 2000-046897 | 2/2000 |
|---|---|---|
| JP | 2000-046915 | 2/2000 |
| JP | 2005-049299 | 2/2005 |

* cited by examiner

*Primary Examiner*—Lincoln Donovan
*Assistant Examiner*—John W Poos
(74) *Attorney, Agent, or Firm*—F. Chau & Associates, LLC

(57) ABSTRACT

A leakage current measurement circuit measuring a substrate leakage current and a gate leakage current in response to a variation in the size of an MOS transistor and a leakage current comparison circuit judging which one of the substrate leakage current and the gate leakage current is dominant. The leakage current measurement circuit includes a charge supply, a leakage current generator and a detection signal generator. The leakage current comparison circuit includes a charge supply, a leakage current comparator and a detection signal generator.

14 Claims, 9 Drawing Sheets

LEAKAGE CURRENT DETECTION CIRCUIT AND LEAKAGE CURRENT COMPARISON CIRCUIT

CROSS-REFERENCE TO RELATED PATENT APPLICATION

This application claims the benefit of Korean Patent Application No. 10-2005-0061782, filed on Jul. 8, 2005, in the Korean Intellectual Property Office, the disclosure of which is incorporated herein in its entirety by reference.

BACKGROUND OF THE INVENTION

1. Technical Field

The present disclosure relates to a semiconductor circuit, and more particularly, to a leakage current detection circuit that detects a substrate leakage current and a gate leakage current of a CMOS transistor.

2. Discussion of the Related Art

When an MOS transistor is turned off, there is no channel formed in the MOS transistor so that current cannot flow between the drain and source regions of the MOS transistor. When a voltage lower than the threshold voltage of the MOS transistor is applied to the gate of the MOS transistor, the energy level of the conduction band of the channel region, which is determined by the voltage applied to the gate, becomes higher than the energy level of the conduction band of the drain and source regions. Charges in the source and drain regions having relatively low energy levels cannot pass through the channel region having a relatively high energy level and disposed between the source and drain regions. Thus, the current cannot flow in the channel region.

When the MOS transistor is turned on, the charges in the source and drain s regions are moved through the channel that is formed in the direction of the length L of the gate. When a voltage that is higher than the threshold voltage is applied to the gate, the energy level of the conduction band of the channel region becomes lower than the energy level present when the MOS is turned off. Thus, the charges in the source and drain regions can easily move.

With the development of improved semiconductor manufacturing techniques, the sizes of integrated elements are scaled down in order to increase the number of integrated transistors. An MOS transistor is scaled down so that the absolute length L and absolute width W of the gate of the MOS transistor are reduced, but the ratio W/L of the length L to the width W of the gate of the MOS transistor is maintained.

When the absolute length L of the gate of the MOS transistor is reduced due to scaling down the MOS transistor, a leakage current between the drain and source of the MOS transistor is easily generated, even when the MOS transistor is turned off. As described above, a voltage lower than the threshold voltage, when applied to the gate of the MOS transistor, increases the energy level of the conduction band of the channel region when the MOS transistor is turned off. However, the width of the conduction band corresponding to the reduced length L of the channel is decreased, and thus charges penetrating the conduction band are generated to cause a leakage current. Here, this leakage current is defined as a substrate leakage current.

The MOS transistor is scaled down in consideration of reducing the voltage applied to the gate of the MOS transistor. Thus, scaling down of the MOS transistor can increase the number of integrated MOS transistors and reduce power consumption of a circuit composed of the MOS transistors. To reduce the voltage applied to the gate, the thickness of a gate insulating layer should be decreased. When the gate insulating layer is thick, charges disposed on both sides of the gate insulating layer cannot move through the gate insulating layer unless they get an enormous amount of energy. When the gate insulating layer becomes thin, however, there exist charges penetrating the gate insulating layer to generate a leakage current. This leakage current is called the gate leakage current.

The ratio W/L of the length L to the width W of the gate is an important factor in determining the current-voltage characteristic of the corresponding MOS transistor. When the length L of the gate is long and the width W is wide, the substrate leakage current does not have a large effect on the current-voltage characteristic of the MOS transistor. Particularly, the gate leakage current hardly affects the current-voltage characteristic of the MOS transistor. When the MOS transistor is scaled down, however, the effect of the gate leakage current, as well as the effect of the substrate leakage current on the current-voltage characteristic of the MOS transistor, cannot be ignored.

Conventionally, a variation in the substrate leakage current and/or a variation in the gate leakage current in response to a variation in the size of the MOS transistor were detected and reflected in the circuit design and process design. In general, the variation of one of the substrate leakage current and the gate leakage current was detected.

A conventional method of measuring the substrate leakage current and gate leakage current was carried out on a specific region of a semiconductor device not just on one MOS transistor. Furthermore, there was a method of detecting only variations in the substrate leakage current in response to variations in the size of the MOS transistor to compare the detected variations in the substrate leakage current or detecting only variations in the gate leakage current in response to variations in the size of the MOS transistor to compare the detected variations in the gate leakage current. However, using this method it is difficult to judge which one of the substrate leakage current and the gate leakage current generated in the same semiconductor device has a dominant effect on the current-voltage characteristic of the MOS transistor.

SUMMARY OF THE INVENTION

Embodiments of the present invention provide a leakage current measurement circuit measuring a substrate leakage current and a gate leakage current in response to a variation in the size of an MOS transistor.

Embodiments of the present invention also provide a leakage current comparison circuit for judging which one of the substrate leakage current and the gate leakage current is dominant.

According to an embodiment of the present invention, there is provided a leakage current measurement circuit including a charge supply and a leakage current generator. The charge supply transfers charges supplied from a first power supply voltage or a second power supply voltage in response to an enable signal or a reverse enable signal that has a phase opposite to that of the enable signal. The leakage current generator makes the charges transferred from the charge supply flow to the first power supply voltage or to the second power supply voltage.

According to an embodiment of the present invention, there is provided a leakage current comparison circuit including a charge supply and a leakage current comparator. The charge supply transfers charges between a first power supply voltage and a leakage current comparator or between a second power supply voltage and the leakage current comparator in response to an enable signal or a reverse enable signal having a phase opposite to that of the enable signal. The leakage current comparator outputs at least one comparative signal representing the result of a comparison of the quantity of charges leaking through a substrate to the quantity of charges leaking through a gate among the charges transferred to or from the charge supply through a comparative signal terminal.

According to an embodiment of the present invention, there is provided a leakage current comparison circuit including a charge supply and a leakage current comparator. The charge supply transfers charges between a first power supply voltage and a leakage current comparator or between a second power supply voltage and the leakage current comparator in response to an enable signal or a reverse enable signal having a phase opposite to that of the enable signal and outputs a first comparative signal and a second comparative signal corresponding to the transferred charges. The leakage current comparator leaks the charges transferred to or from the charge supply to the first or second power supply voltage through a substrate or a gate.

BRIEF DESCRIPTION OF THE DRAWINGS

Exemplary embodiments of the present invention can be understood in more detail from the following descriptions taken in conjunction with the attached drawings in which.

DESCRIPTION OF THE EXEMPLARY EMBODIMENTS

Exemplary embodiments of the present invention are described more fully hereinafter with reference to the accompanying drawings. The invention may, however, be embodied in many different forms and should not be construed as being limited to the embodiments set forth herein.

Figure 1:
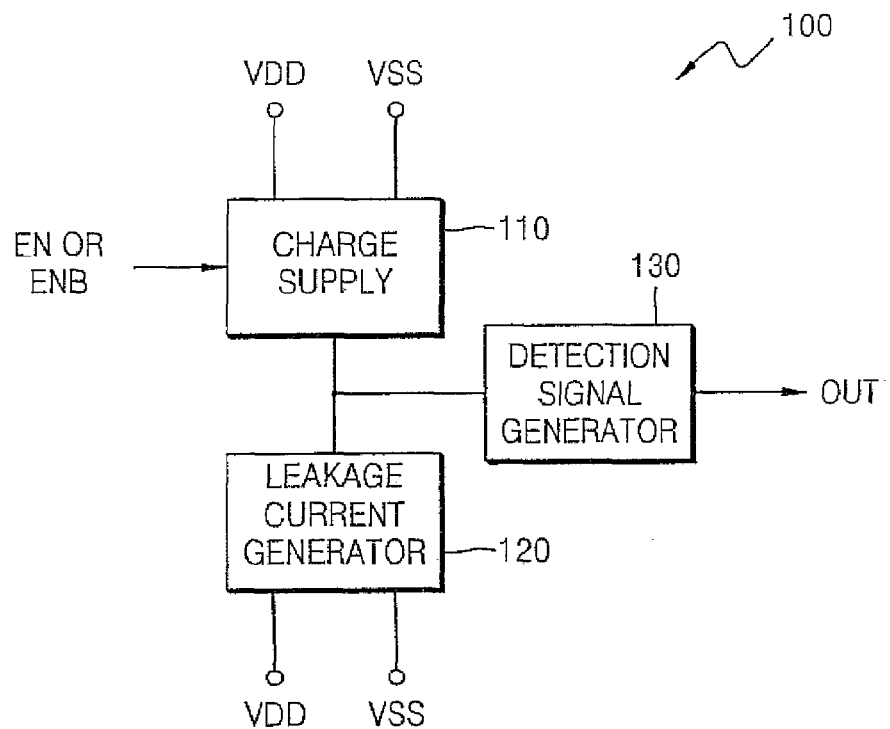
FIG. 1 is a block diagram of a leakage current measurement circuit according to an embodiment of the present invention.

FIG. 1 is a block diagram of a leakage current measurement circuit 100 according to an embodiment of the present invention. Referring to FIG. 1, the leakage current measurement circuit 100 includes a charge supply 110, a leakage current generator 120, and a detection signal generator 130. The charge supply 110 transfers charges supplied from a first power supply voltage VDD or a second power supply voltage VSS to the leakage current generator 120 in response to an enable signal EN or a reverse enable signal ENB having a phase opposite to that of the enable signal EN. In addition, the charge supply 110 preserves previously supplied charges when the first power supply voltage VDD or the second power supply voltage VSS does not provide charges any more after the charges have been supplied from the first voltage VDD or the second voltage VSS.

The leakage current generator 120 makes the charges transferred from the charge supply 110 flow to the first power supply voltage VDD or the second power supply voltage VSS. When the charges transferred from the charge supply 110 are holes supplied from the first power supply voltage VDD, the leakage current generator 120 makes the holes flow to the second power supply voltage VSS. When the charges transmitted from the charge supply 110 are electrons supplied from the second power supply voltage VSS, the leakage current generator 120 makes the electrons flow to the first power supply voltage VDD. The detection signal generator 130 outputs a detection signal OUT corresponding to the quantity of the charges flowing from the charge supply 110 to the leakage current generator 120. Here, the first power supply voltage VDD is higher than the second power supply voltage VSS.

Figure 2:
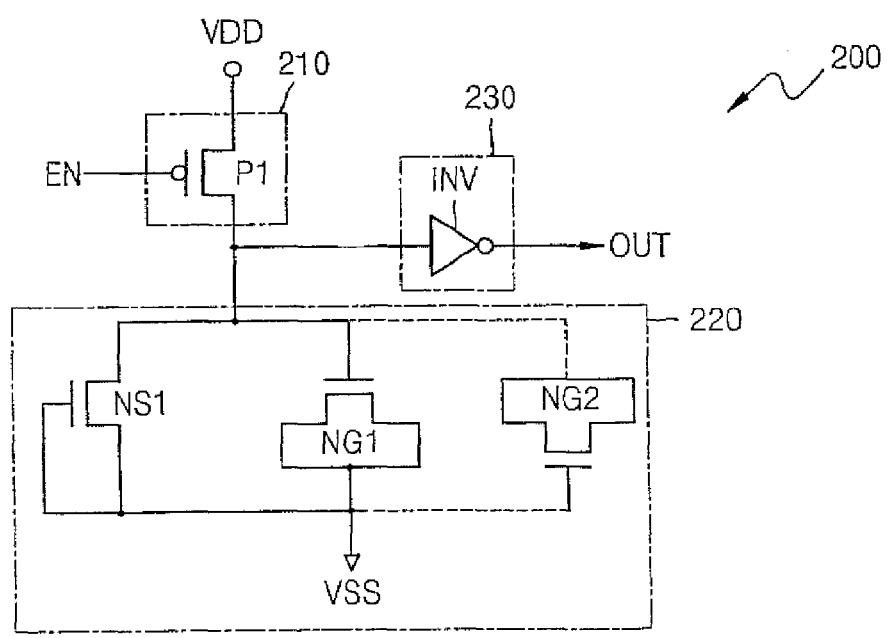
FIG. 2 illustrates the leakage current measurement circuit of FIG. 1 according to an embodiment of the present invention.

FIG. 2 illustrates the leakage current measurement circuit of FIG. 1 according to an embodiment of the present invention. Referring to FIG. 2, the leakage current measurement circuit 200 includes a charge supply 210, a leakage current generator 220 and a detection signal generator 230 and detects a leakage through a substrate of an N-type MOS transistor and a leakage through a gate insulating layer thereof.

The charge supply 210 includes a P-type MOS transistor P1 having a source coupled to the first power supply voltage VDD, a drain coupled to the leakage current generator 220 and a gate to which the enable signal EN is applied.

The leakage current generator 220 includes a first N-type MOS transistor NS1 used for generating a substrate leakage current. The leakage current generator 220 further includes one of a second N-type MOS transistor NG1 and a third N-type MOS transistor NG2. In FIG. 2, a dotted line means that the second N-type MOS transistor NG1 and the third N-type MOS transistor NG2 can be selectively used.

The first N-type MOS transistor NS1 has a drain coupled to the charge supply 210, a source connected to the second power supply voltage VSS, and a gate to which the second power supply voltage VSS is applied. The second N-type MOS transistor NG1 has a drain and a source coupled to the second power supply voltage VSS and a gate coupled to the charge supply 210. The third N-type MOS transistor NG2 has a drain and a source coupled to the charge supply 210 and a gate coupled to the second power supply voltage VSS.

The detection signal generator 230 includes an inverter INV having an input terminal connected to a common terminal of the charge supply 210 and the leakage current generator 220 and outputs the detection signal OUT through an output terminal.

The operation of the leakage current measurement circuit of FIG. 2 will now be explained.

The first N-type MOS transistor NS1 is turned off because the second power supply voltage VSS, which is lower than the threshold voltage of the first N-type MOS transistor NS1, is applied to the gate of the first N-type MOS transistor. A gate insulating layer (not shown) is disposed between the gates of the second N-type MOS transistor NG1 and third N-type MOS transistor NG2 and a substrate, and thus a DC path from the first power supply voltage VDD to the second power supply voltage VSS is blocked. Accordingly, when the enable signal EN turns on the P-type MOS transistor P1, the drain of the P-type MOS transistor P1 at which charges supplied from the first power supply voltage VDD are accumulated has the same voltage value as the first power supply voltage VDD.

When the voltage level of the enable signal EN is varied to turn off the P-type MOS transistor P1, the charges accumulated at the drain of the P-type MOS transistor P1 are preserved, and additional charges are not supplied to the P-type MOS transistor P1. Accordingly, the output signal OUT of the inverter INV of the detection signal generator 230 becomes a logic low state due to the accumulated charges. The voltage level of the output signal OUT of the inverter INV is maintained if the charges accumulated at the drain of the P-type MOS transistor P1 do not leak.

When charges that are moved through the substrate of the N-type MOS transistor NS1 for generating the substrate leakage current and charges penetrating the N-type MOS transistors NG1 and NG2 for generating the gate leakage current generate leakage currents, the charges accumulated at the drain of the P-type MOS transistor P1 are slowly decreased. The output signal OUT of the inverter INV operating in response to the charges accumulated at the drain of the P-type MOS transistor P1 is changed from the logic low state to a logic high state after the charges have leaked for a predetermined period of time.

Here, the period of time that it takes for the output signal OUT of the inverter INV to be changed from the logic low state to the logic high state after the enable signal EN has turned off the P-type MOS transistor P1 is detected. Then, it is possible to judge whether the quantity of charges leaked is allowable using the detected period of time.

Figure 3:
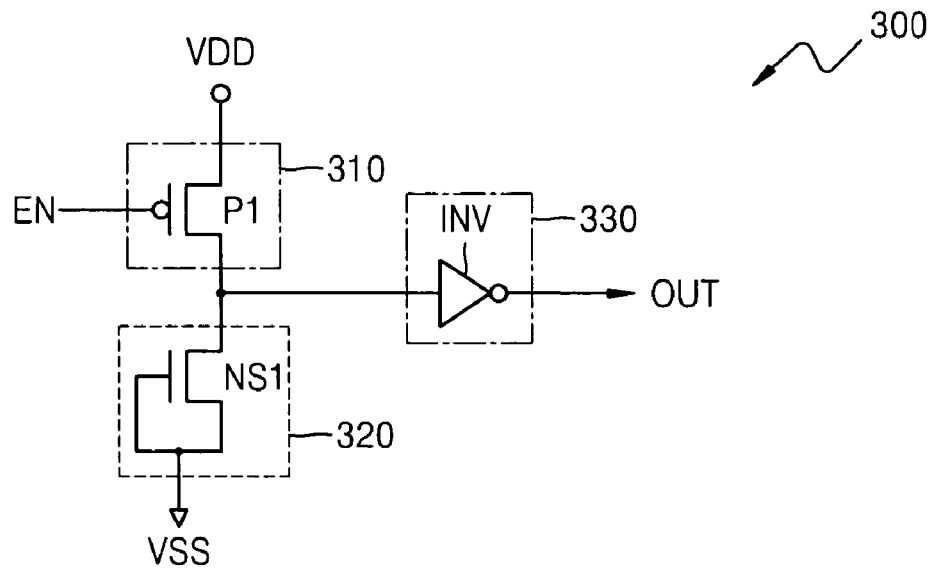
FIG. 3 illustrates the leakage current measurement circuit of FIG. 1 according to an embodiment of the present invention.

FIG. 3 illustrates the leakage current measurement circuit of FIG. 1 according to an embodiment of the present invention. Referring to FIG. 3, the leakage current measurement circuit 300 includes a charge supply 310, a leakage current generator 320 and a detection signal generator 330 and detects a leakage current through a substrate of an N-type MOS transistor.

The charge supply 310 includes a P-type MOS transistor P1 having a source coupled to the first power supply voltage VDD, a drain coupled to the leakage current generator 320 and a gate to which the enable signal EN is applied.

The leakage current generator 320 includes an N-type MOS transistor NS1 having a drain coupled to the charge supply 310, a source connected to the second power supply voltage VSS, and a gate to which the second power supply voltage VSS is applied. The detection signal generator 330 includes an inverter INV having an input terminal connected to a common terminal of the charge supply 310 and the leakage current generator 320 and outputting the detection signal OUT through an output terminal.

The components of the leakage current measurement circuit 300 of FIG. 3 are identical to those of the leakage current measurement circuit 200 of FIG. 2 other than the internal components of the leakage current generators 220 and 320. That is, the leakage current generator 320 shown in FIG. 3 detects only the substrate leakage current while the leakage current generator 220 shown in FIG. 2 detects both the substrate leakage current and gate leakage current. The operation of the leakage current measurement circuit 300 is identical to that of the leakage current measurement circuit 200 so that explanation therefor is omitted.

Figure 4:
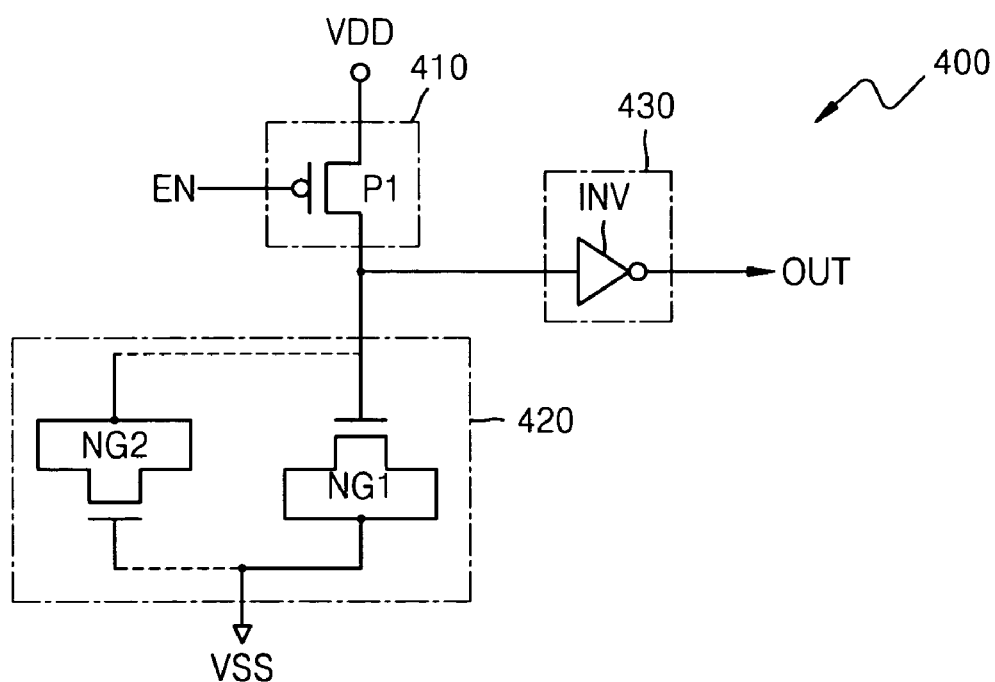
FIG. 4 illustrates the leakage current measurement circuit of FIG. 1 according to an embodiment of the present invention.

FIG. 4 illustrates the leakage current measurement circuit of FIG. 1 according to an embodiment of the present invention. Referring to FIG. 4, the leakage current measurement circuit 400 includes a charge supply 410, a leakage current generator 420 and a detection signal generator 430 and detects a leakage current through a gate insulating layer of an N-type MOS transistor.

The components of the leakage current measurement circuit 400 of FIG. 4 are identical to those of the leakage current measurement circuit 200 of FIG. 2 except the leakage current generators 220 and 420, so that only the leakage current generator 420 is explained.

The leakage current generator 420 selectively includes a first N-type MOS transistor NG1 and a second N-type MOS transistor NG2. The first N-type MOS transistor NG1 has a drain and a source, which are connected to each other and coupled to the second power supply voltage VSS, and a gate connected to the charge supply 410. The second N-type MOS transistor NG2 has a drain and a source, which are connected to each other and coupled to the charge supply 410, and a gate coupled to the second power supply voltage VSS.

The leakage current measurement circuit 200 of FIG. 2, the leakage current measurement circuit 300 of FIG. 3 and the leakage current measurement circuit 400 of FIG. 4 are identical to one another except that their leakage current generators 220, 320 and 420 have different internal components. Thus, the operations of the leakage current measurement circuit 300 of FIG. 3 and the leakage current measurement circuit 400 of FIG. 4 refer to the operation of the leakage current measurement circuit 200 of FIG. 2.

The leakage current measurement circuits 200, 300 and 400 respectively shown in FIGS. 2, 3 and 4 detect leakage currents through the N-type MOS transistors NS1, NG1 and NG2, and leakage current measurement circuits shown in FIGS. 5, 6 and 7, which will be explained below, detect leakage currents through P-type MOS transistors PS1, PG1 and PG2.

Figure 5:
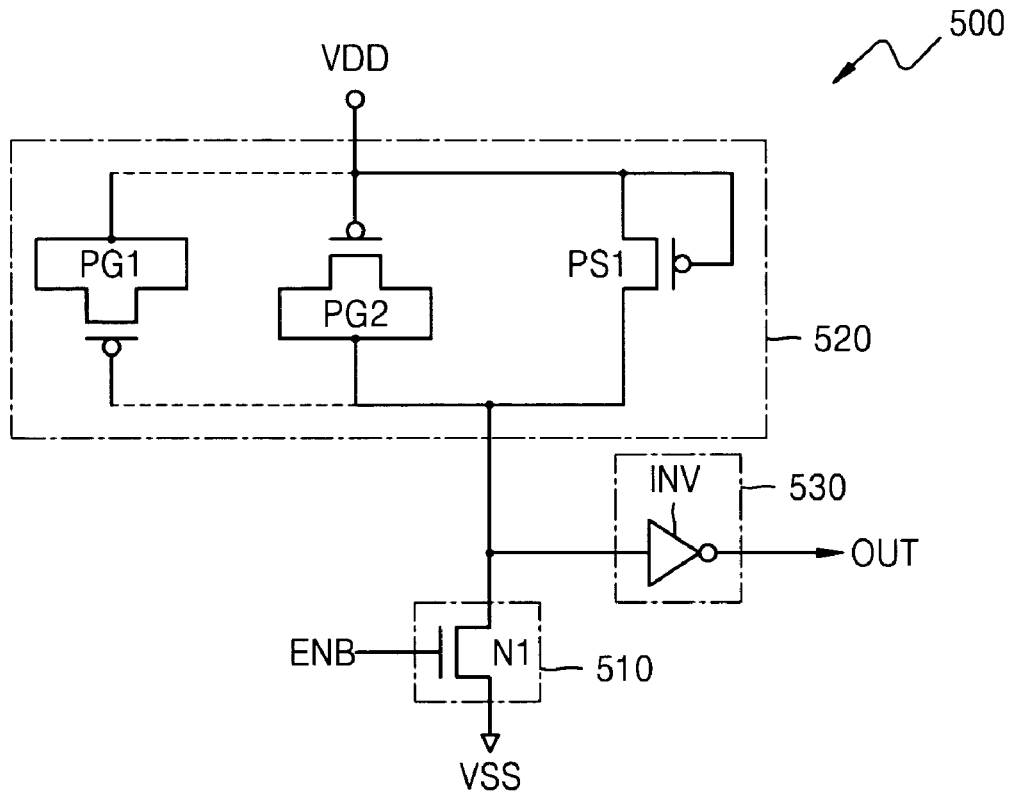
FIG. 5 illustrates the leakage current measurement circuit of FIG. 1 according to an embodiment of the present invention.

FIG. 5 illustrates the leakage current measurement circuit of FIG. 1 according to an embodiment of the present invention. Referring to FIG. 5, the leakage current measurement circuit 500 includes a charge supply 510, a leakage current generator 520 and a detection signal generator 530 and detects a leakage through a substrate of a P-type MOS transistor and a leakage through a gate insulating layer thereof.

The charge supply 510 includes an N-type MOS transistor N1 having a source coupled to the second power supply voltage VSS, a drain coupled to the leakage current generator 520 and a gate to which the reverse enable signal ENB is applied.

The leakage current generator 520 includes a first P-type MOS transistor PS1 for generating a substrate leakage current. The leakage current generator 520 further includes one of a second P-type MOS transistor PG1 and a third P-type MOS transistor PG2. In FIG. 5, a dotted line means that the second P-type MOS transistor PG1 and the third P-type MOS transistor PG2 can be selectively used.

The first P-type MOS transistor PS1 has a drain coupled to the charge supply 510, a source and a gate connected to the first power supply voltage VDD. The second P-type MOS transistor PG1 has a drain and a source coupled to the first power supply voltage VDD and a gate coupled to the charge supply 510. The third P-type MOS transistor PG2 has a drain and a source coupled to the charge supply 510 and a gate coupled to the first power supply voltage VDD.

The operation of the leakage current measurement circuit 500 of FIG. 5 will now be explained.

The first P-type MOS transistor PS1 is turned off because the first power supply voltage VDD, which is higher than the threshold voltage of the first P-type MOS transistor PS1, is applied to the gate of the first P-type MOS transistor PS1. A gate insulating layer (not shown) is disposed between the gates of the second P-type MOS transistor PG1 and third P-type MOS transistor PG2 and the substrate, and thus a DC path from the first power supply voltage VDD to the second power supply voltage VSS is blocked. Accordingly, when the reverse enable signal ENB turns on the N-type MOS transistor N1, the drain of the N-type MOS transistor N1 at which charges supplied from the second power supply voltage VSS are accumulated has the same voltage value as the second power supply voltage VSS.

When the reverse voltage level of the enable signal ENB is varied to turn off the N-type MOS transistor N1, the charges accumulated at the drain of the N-type MOS transistor N1 are preserved but more charges are not supplied to the N-type MOS transistor N1. Accordingly, the output signal OUT of the inverter INV of the detection signal generator 530, which is operated in response to the accumulated charges, becomes a logic high state. The voltage level of the output signal OUT of the inverter INV maintains the logic high state if the charges accumulated at the drain of the N-type MOS transistor N1 do not leak.

When a leakage current caused by charges passing through the substrate of the P-type MOS transistor PS1 and a leakage current caused by charges passing through the gate insulating layers of the P-type MOS transistors PG1 and PG2 are generated, the charges accumulated at the drain of the N-type MOS transistor N1 are gradually decreased. When more than a predetermined quantity of charges is leaked with the lapse of a predetermined period of time after the charges have started to decrease, the output signal OUT of the inverter INV is changed from the logic high state to a logic low state.

Here, the period of time that it takes for the output signal OUT of the inverter INV to be changed from the logic high state to the logic low state after the reverse enable signal ENB has turned off the N-type MOS transistor N1 is detected. Then, it is possible to judge whether the quantity of charges leaked is allowable using this detected period of time.

Figure 6:
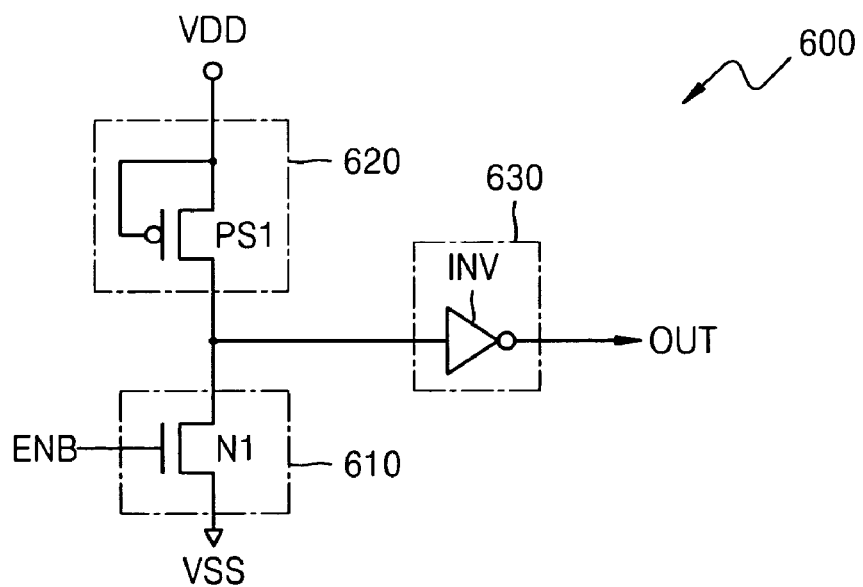
FIG. 6 illustrates the leakage current measurement circuit of FIG. 1 according to an embodiment of the present invention.

FIG. 6 illustrates the leakage current measurement circuit of FIG. 1 according to an embodiment of the present invention. Referring to FIG. 6, the leakage current measurement circuit 600 includes a charge supply 610, a leakage current generator 620 and a detection signal generator 630 and detects a leakage current through a substrate of a P-type MOS transistor.

The charge supply 610 includes an N-type MOS transistor N1 having a source coupled to the second power supply voltage VSS, a drain coupled to the leakage current generator 620 and a gate to which the reverse enable signal ENB is applied. The leakage current generator 620 includes a P-type MOS transistor PS1 having a drain coupled to the charge supply 610, a source coupled to the first power supply voltage VDD, and a gate to which the first power supply voltage VDD is applied. The detection signal generator 630 includes an inverter INV having an input terminal connected to a common terminal of the charge supply 610 and the leakage current generator 620 and outputting the detection signal OUT through an output terminal.

The components of the leakage current measurement circuit 600 of FIG. 6 are identical to those of the leakage current measurement circuit 500 of FIG. 5 other than the internal components of the leakage current generators 520 and 620. That is, the leakage current measurement circuit 600 of FIG. 6 is distinguished from the leakage current measurement circuit 500 of FIG. 5 in that the leakage current generator 620 shown in FIG. 6 detects only the substrate leakage current while the leakage current generator 520 shown in FIG. 5 detects both the substrate leakage current and gate leakage current.

Figure 7:
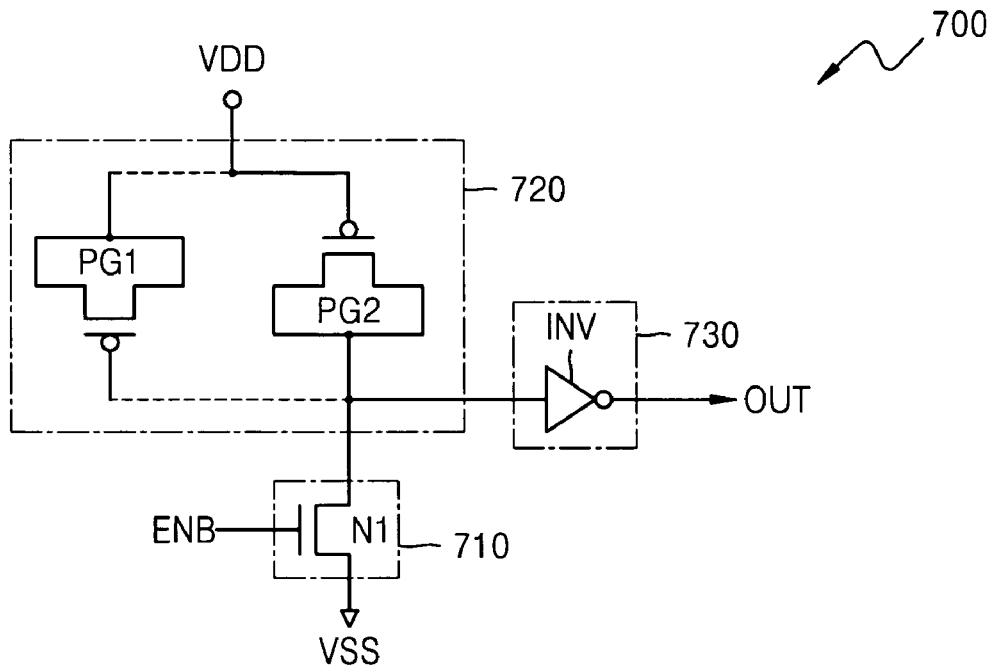
FIG. 7 illustrates the leakage current measurement circuit of FIG. 1 according to an embodiment of the present invention.

FIG. 7 illustrates the leakage current measurement circuit of FIG. 1 according to an embodiment of the present invention. Referring to FIG. 7, the leakage current measurement circuit 700 includes a charge supply 710, a leakage current generator 720 and a detection signal generator 730 and detects a leakage current through a gate insulating layer.

The charge supply 710 includes an N-type MOS transistor N1 having a source coupled to the second power supply voltage VSS, a drain coupled to the leakage current generator 720, and a gate to which the reverse enable signal ENB is applied.

The leakage current generator 720 selectively includes one of a first P-type MOS transistor PG1 and a second P-type MOS transistor PG2. The first P-type MOS transistor PG1 has a drain and a source, which are connected to each other and coupled to the first power supply voltage VDD, and a gate coupled to the charge supply 710. The second P-type MOS transistor PG2 has a drain and a source, connected to each other and coupled to the charge supply 710, and a gate coupled to the first power supply voltage VDD. The detection signal generator 730 includes an inverter INV having an input terminal connected to a common terminal of the charge supply 710 and the leakage current generator 720 and outputting the detection signal OUT through an output terminal.

The leakage current measurement circuit 500 of FIG. 5, the leakage current measurement circuit 600 of FIG. 6 and the leakage current measurement circuit 700 of FIG. 7 are identical to one another except that their leakage current generators 520, 620 and 720 have different internal components. The leakage current generator 520, 620, and 720 detect a leakage current through the gate insulating layer or a leakage current through the substrate.

The leakage current measurement circuits according to the present invention, shown in FIGS. 1 through 7, measure the absolute quantity of leakage current caused by charges penetrating substrates and gate insulating layers of N-type and P-type MOS transistors constructing a semiconductor integrated circuit. However, it is not possible to judge which one of the substrate leakage current caused by charges penetrating the substrates and the gate leakage current caused by charges penetrating the gate insulating layers is larger than the other.

Leakage current measurement circuits capable of judging which one of the substrate leakage current and the gate leakage current is relatively larger will now be explained.

Figure 8:
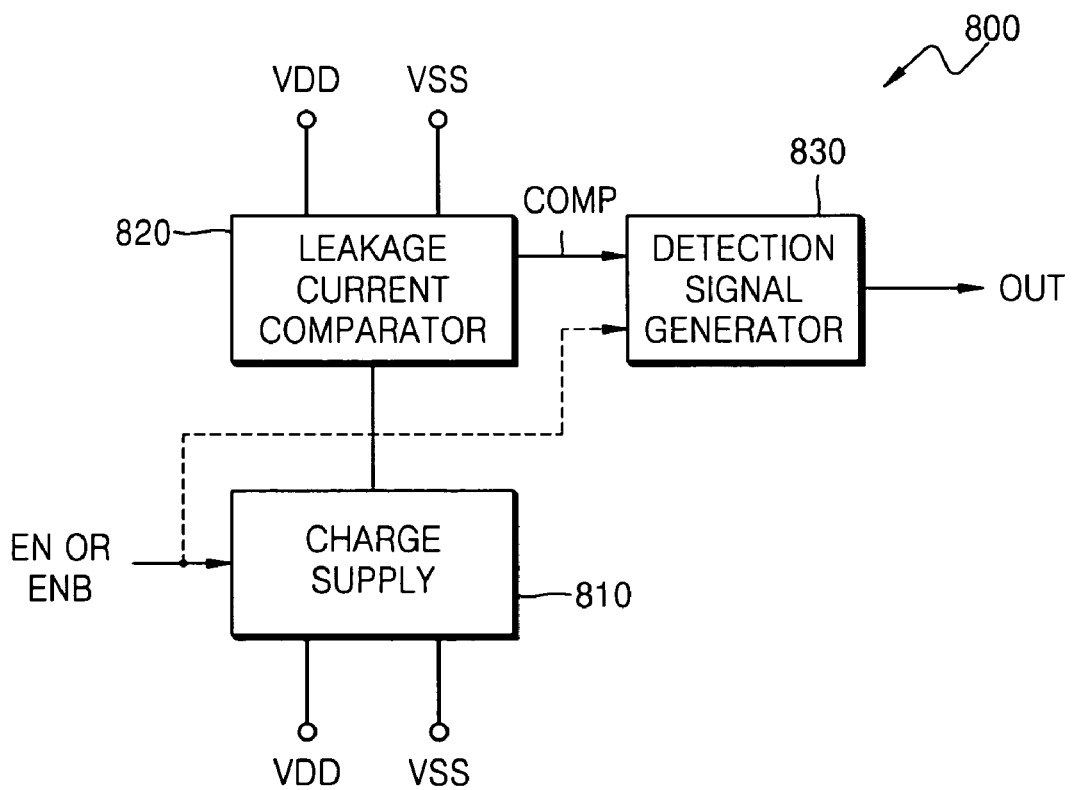
FIG. 8 is a block diagram of a leakage current comparison circuit according to an embodiment of the present invention.

FIG. 8 is a block diagram of a leakage current comparison circuit 800 according to an embodiment of the present invention. Referring to FIG. 8, the leakage current comparison circuit 800 includes a charge supply 810, a leakage current comparator 820, and a detection signal generator 830.

The charge supply 810 transfers charges between a first power supply voltage VDD and the leakage current comparator 820 or between a second power supply voltage VSS and the leakage current comparator 820 in response to an enable signal EN or a reverse enable signal ENB having a phase opposite to that of the enable signal EN. The leakage current comparator 820 outputs at least one comparative signal COMP representing a result of comparison of the quantity of charges leaking through a substrate to the quantity of charges leaking through a gate among the charges transferred to or from the charge supply 810. The detection signal generator 830 outputs a detection signal OUT in response to the enable signal EN, the reverse enable signal ENB and the comparative signal COMP.

Circuits of FIGS. 9, 10, 11, and 12 that embody the leakage current comparison circuit of FIG. 8 use operational transconductance amplifiers (OTA). The circuits of FIGS. 9 and 10 relate to leakage charges penetrating a substrate and gate insulating layer of an N-type MOS transistor, and the circuits of FIGS. 11 and 12 relate to leakage charges penetrating a substrate and gate insulating layer of a P-type MOS transistor.

Figure 9:
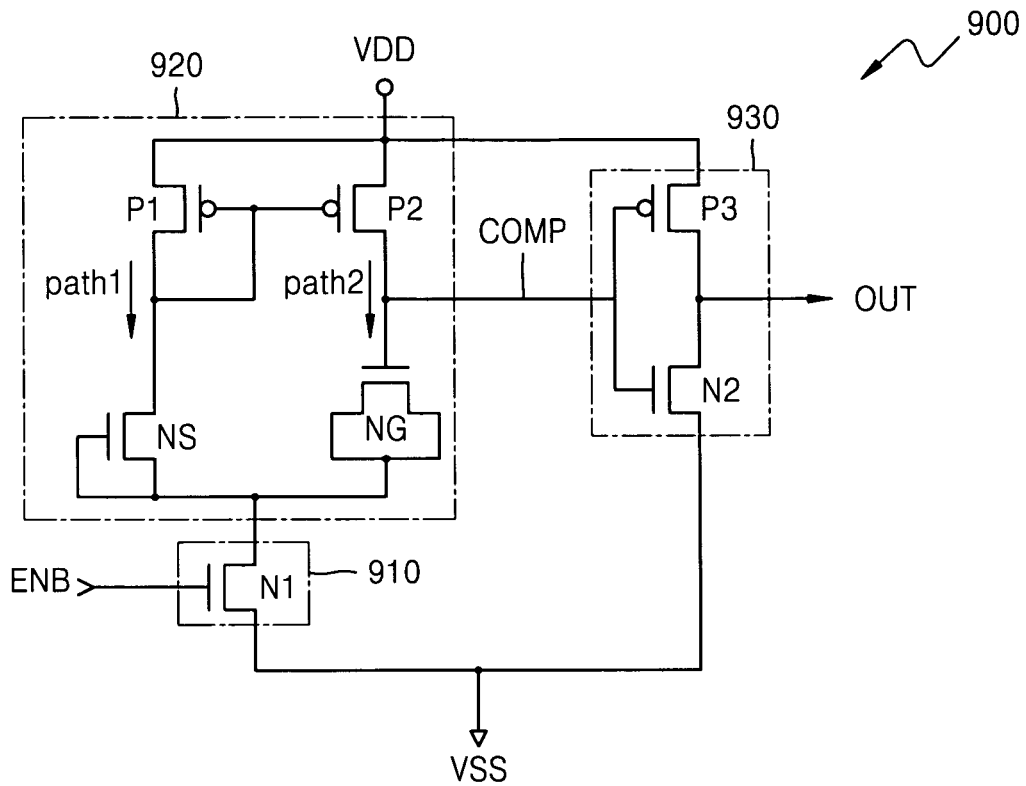
FIG. 9 illustrates the leakage current comparison circuit of FIG. 8 according to an embodiment of the present invention.

FIG. 9 illustrates the leakage current comparison circuit of FIG. 8 according to an embodiment of the present invention. Referring to FIG. 9, the leakage current comparison circuit 900 includes a charge supply 910, a leakage current comparator 920 and a detection signal generator 930.

The charge supply 910 includes an N-type MOS transistor N1 having a source coupled to the second power supply voltage VSS, a drain coupled to the leakage current comparator 920, and a gate to which the reverse enable signal ENB is applied.

The leakage current comparator 920 includes a first P-type MOS transistor P1, a second P-type MOS transistor P2, an N-type MOS transistor NS for substrate leakage, and an N-type MOS transistor NG for gate leakage. The first P-type MOS transistor P1 has a source coupled to the first power supply voltage VDD, a drain and a gate coupled to each other. The second P-type MOS transistor P2 has a source coupled to the first power supply voltage VDD, a drain coupled to a comparative signal terminal COMP, and a gate coupled to the gate and drain of the first P-type MOS transistor P1. The N-type MOS transistor NS for substrate leakage has a drain coupled to the drain of the first P-type MOS transistor, a gate and a source coupled to the charge supply 910. The N-type MOS transistor NG for gate leakage has a gate coupled to the comparative signal terminal COMP, a drain and a source coupled to the charge supply 910.

The first P-type MOS transistor P1 and the second P-type MOS transistor P2 of the leakage current comparator 920 construct a current mirror supplying current to a first path Path1 and a second path Path2. Here, the first path Path1 includes the first P-type MOS transistor P1 and the N-type MOS transistor NS for substrate leakage, and the second path Path2 includes the second P-type MOS transistor P2 and the N-type MOS transistor NG for gate leakage.

The detection signal generator 930 includes a third P-type MOS transistor P3 having a drain coupled to an output terminal OUT, a source coupled to the first power supply voltage VDD, and a gate receiving the comparative signal COMP, and a second N-type MOS transistor N2 having a drain coupled to the output terminal OUT, a source coupled to the second power supply voltage VSS, and a gate receiving the comparative signal COMP. The third P-type MOS transistor P3 and the second N-type MOS transistor N2 construct an inverter.

The operation of the leakage current comparison circuit of FIG. 9 will now be explained.

The quantity of charges leaking through the N-type MOS transistor NS for substrate leakage and the N-type MOS transistor NG for gate leakage determines the quantity of current flowing through the first and second paths Path1 and Path2. When the quantity of leakage current flowing through the first path Path1 is larger than the quantity of leakage current flowing through the second path Path2, the voltage level of the comparative signal COMP responding to the quantity of current flowing through the second path Path2 is increased. Accordingly, the voltage level of the output signal OUT becomes a logic low state. On the contrary, when the quantity of leakage current flowing through the first path Path1 is smaller than the quantity of leakage current flowing through the second path Path2, the voltage level of the comparative signal COMP responding to the quantity of current flowing through the second path Path2 is decreased. Thus, the voltage level of the output signal OUT becomes a logic high state. Accordingly, it can be known that the quantity of substrate leakage current is relatively larger when the output signal OUT has a logic low level, which means that the quantity of leakage current flowing through the first path Path1 is larger that the quantity of leakage current flowing through the second path Path2. On the contrary, it can be known that the quantity of gate leakage current is relatively larger when the output signal OUT has a logic high level, which means that the quantity of leakage current flowing through the second path Path2 is larger that the quantity of leakage current flowing through the first path Path1.

While it is not shown in FIG. 9, the gate of the N-type MOS transistor NG for gate leakage can be coupled to the charge supply 910 and the drain and source thereof can be coupled to the comparative signal terminal COMP.

Figure 10:
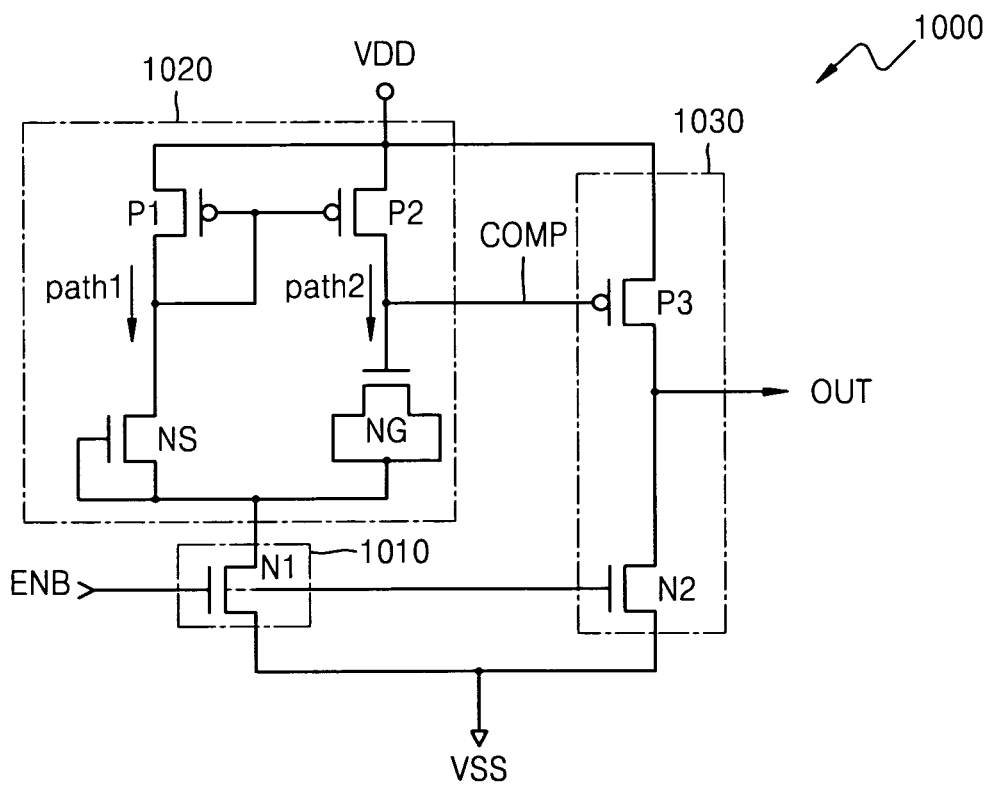
FIG. 10 illustrates the leakage current comparison circuit of FIG. 8 according to an embodiment of the present invention.

FIG. 10 illustrates the leakage current comparison circuit of FIG. 8 according to an embodiment of the present invention. Referring to FIG. 10, the leakage current comparison circuit 1000 includes a charge supply 1010, a leakage current comparator 1020 and a detection signal generator 1030.

The leakage current comparison circuit 900 of FIG. 9 is identical to the leakage current comparison circuit 1000 of FIG. 10 except that the signal applied to the gate of the inverter P3 and transistor N2 constructing the detection signal generator 930 of FIG. 9 is different from the signal applied to the gate of the inverter P3 and transistor N2 constructing the detection signal generator 1030 of FIG. 10. Thus, only the detection signal generator 1030 is described and explanations for the other components are omitted.

The detection signal generator 1030 includes a third P-type MOS transistor P3 having a drain coupled to the output terminal OUT, a source coupled to the first power supply voltage VDD, and a gate receiving the comparative signal COMP, and a second N-type MOS transistor N2 having a drain coupled to the output terminal OUT, a source coupled to the second power supply voltage VSS, and a gate receiving the reverse enable signal ENB.

Figure 11:
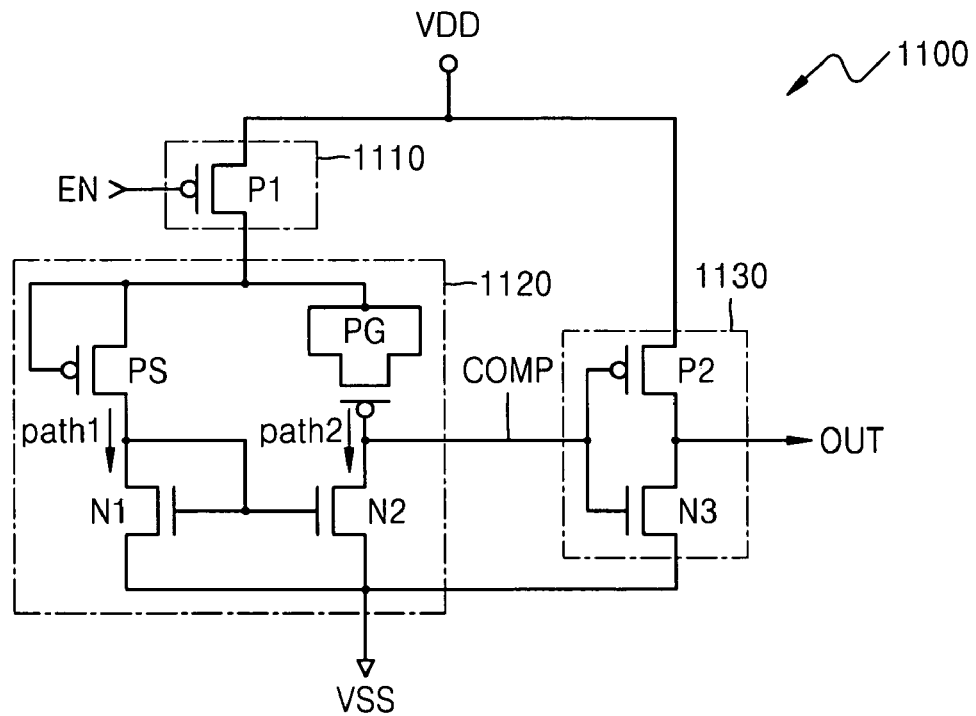
FIG. 11 illustrates the leakage current comparison circuit of FIG. 8 according to an embodiment of the present invention.

FIG. 11 illustrates the leakage current comparison circuit of FIG. 8 according to an embodiment of the present invention. Referring to FIG. 11, the leakage current comparison circuit 1100 includes a charge supply 1110, a leakage current comparator 1120 and a detection signal generator 1130.

The charge supply 1110 includes a first P-type MOS transistor P1 having a source coupled to the first power supply voltage VDD, a drain coupled to the leakage current comparator 1120, and a gate to which the enable signal EN is applied.

The leakage current comparator 1120 includes a first N-type MOS transistor N1, a second N-type MOS transistor N2, a P-type MOS transistor PS for substrate leakage, and a P-type MOS transistor PG for gate leakage. The first N-type MOS transistor N1 has a source coupled to the second power supply voltage VSS, a drain and a gate coupled to each other. The second N-type MOS transistor N2 has a source coupled to the second power supply voltage VSS, a drain coupled to a comparative signal terminal COMP, and a gate coupled to the gate of the first N-type MOS transistor N1. The P-type MOS transistor PS for substrate leakage has a drain coupled to the drain of the first N-type MOS transistor N1, a gate and a source coupled to the charge supply 1110. The P-type MOS transistor PG for gate leakage has a gate coupled to the comparative signal terminal COMP, a drain and a source connected to the charge supply 1110.

The detection signal generator 1130 includes a second P-type MOS transistor P2 having a drain coupled to an output terminal OUT, a source coupled to the first power supply voltage VDD, and a gate receiving the comparative signal COMP, and a third N-type MOS transistor N3 having a drain coupled to the output terminal OUT, a source coupled to the second power supply voltage VSS, and a gate receiving the comparative signal COMP. The second P-type MOS transistor P2 and the third N-type MOS transistor N3 construct an inverter.

The first N-type MOS transistor N1 and the second N-type MOS transistor N2 of the leakage current comparator 1120 construct a current mirror supplying current to a first path Path1 and a second path Path2.

The operation of the leakage current comparison circuit of FIG. 11 is identical to that of the leakage current comparison circuit of FIG. 9 so that explanation therefor is omitted.

While it is not shown in FIG. 11, the gate of the P-type MOS transistor PG can be coupled to the charge supply 1110 and the drain and source thereof can be coupled to the comparative signal terminal COMP.

Figure 12:
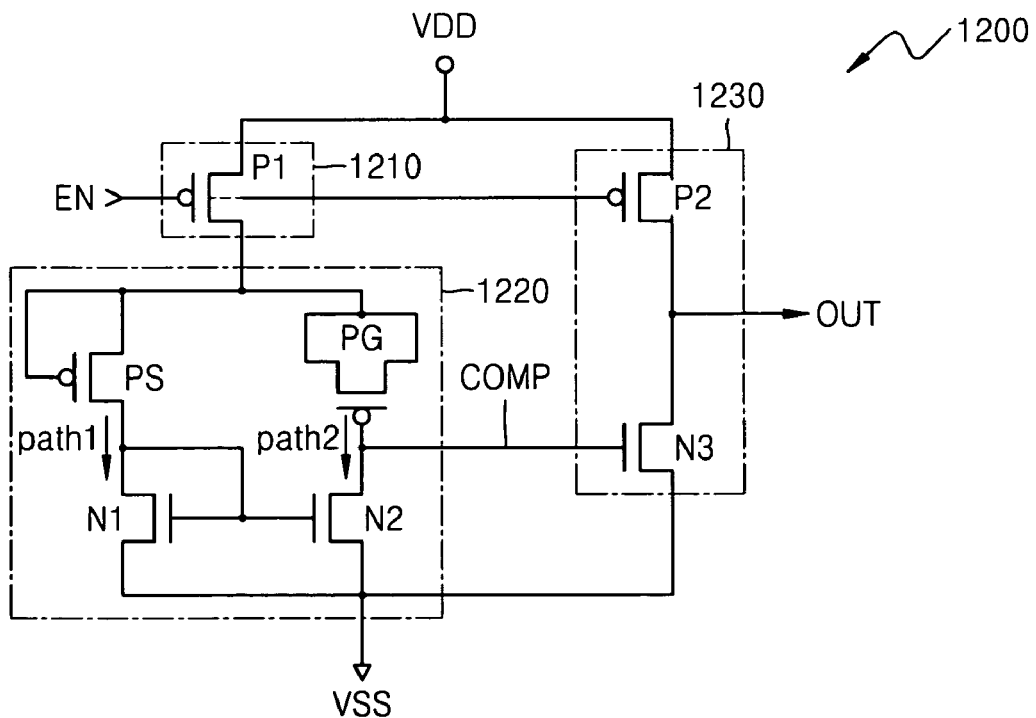
FIG. 12 illustrates the leakage current comparison circuit of FIG. 8 according to an embodiment of the present invention.

FIG. 12 illustrates the leakage current comparison circuit of FIG. 8 according to an embodiment of the present invention. Referring to FIG. 12, the leakage current comparison circuit 1200 includes a charge supply 1210, a leakage current comparator 1220 and a detection signal generator 1230.

The leakage current comparison circuit 1100 of FIG. 11 is identical to the leakage current comparison circuit 1200 of FIG. 12 except that the signal applied to the gate of the inverter constructing the detection signal generator 1130 of FIG. 11 is different from the signal applied to the gate of the inverter constructing the detection signal generator 1230 of FIG. 12. Thus, only the detection signal generator 1230 is described and explanations for the other components are omitted.

The detection signal generator 1230 includes a second P-type MOS transistor P2 having a drain coupled to the output terminal OUT, a source coupled to the first power supply voltage VDD, and a gate receiving the enable signal EN, and a third N-type MOS transistor N3 having a drain coupled to the output terminal OUT, a source coupled to the second power supply voltage VSS, and a gate receiving the comparative signal COMP.

Figure 13:
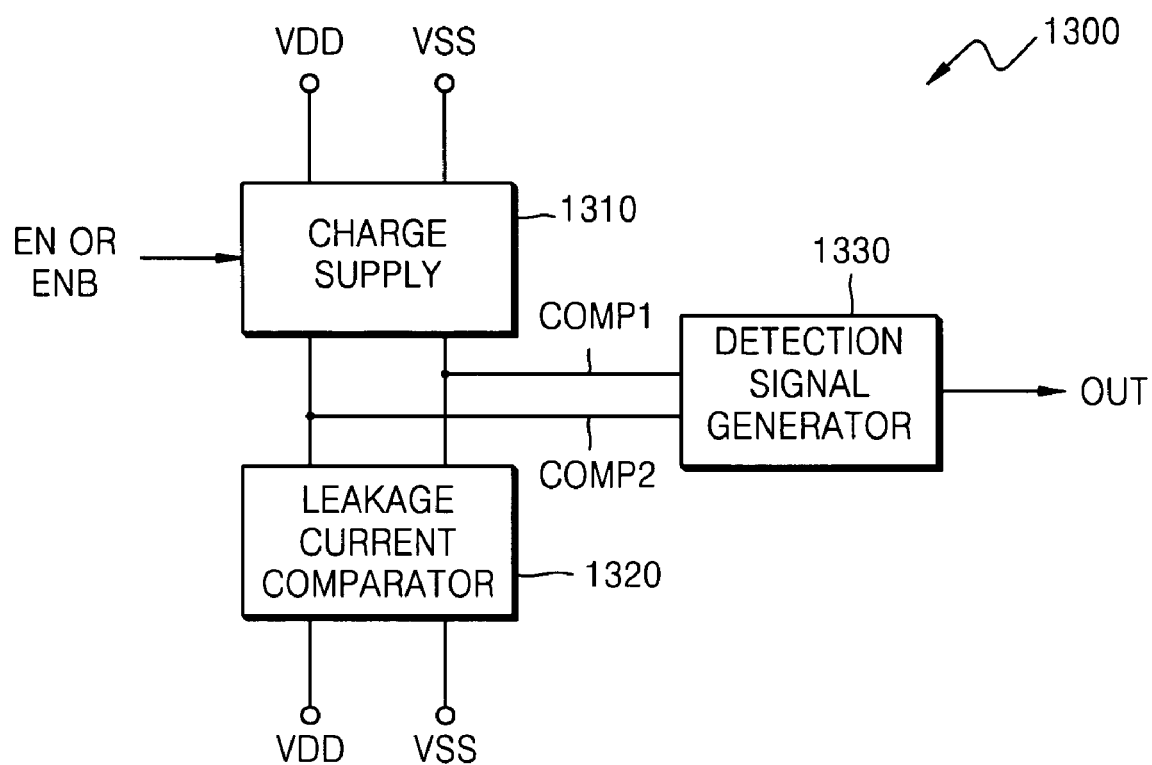
FIG. 13 is a block diagram of a leakage current comparison circuit according to an embodiment of the present invention.

FIG. 13 is a block diagram of a leakage current comparison circuit according to an embodiment of the present invention. Referring to FIG. 13, the leakage current comparison circuit 1300 includes a charge supply 1310, a leakage current comparator 1320 and a detection signal generator 1330.

The charge supply 1310 transfers charges between a first power supply voltage VDD and the leakage current comparator 1320 or between a second power supply voltage VSS and the leakage current comparator 1320 in response to an enable signal EN or a reverse enable signal ENB having a phase opposite to that of the enable signal EN, and outputs a first comparative signal COMP1 and a second comparative signal COMP2 corresponding to the transferred charges. The leakage current comparator 1320 leaks charges transferred to or from the charge supply 1310 to the first power supply voltage VDD or the second power supply voltage VSS through a substrate or a gate of an MOS transistor. The detection signal generator 1330 compares the first comparative signal COMP1 and the second comparative signal COMP2 and outputs a detection signal OUT.

Figure 14:
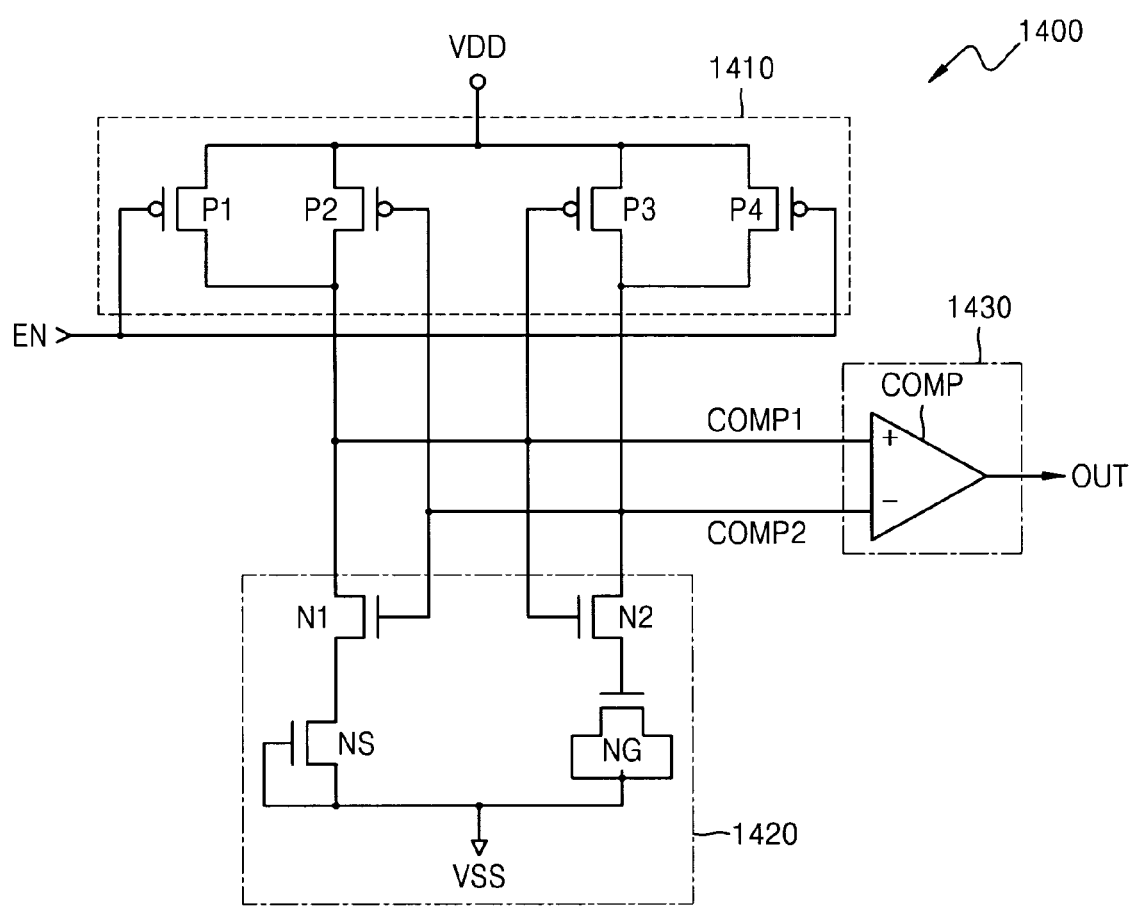
FIG. 14 illustrates the leakage current comparison circuit of FIG. 13 according to an embodiment of the present invention.
Figure 15:
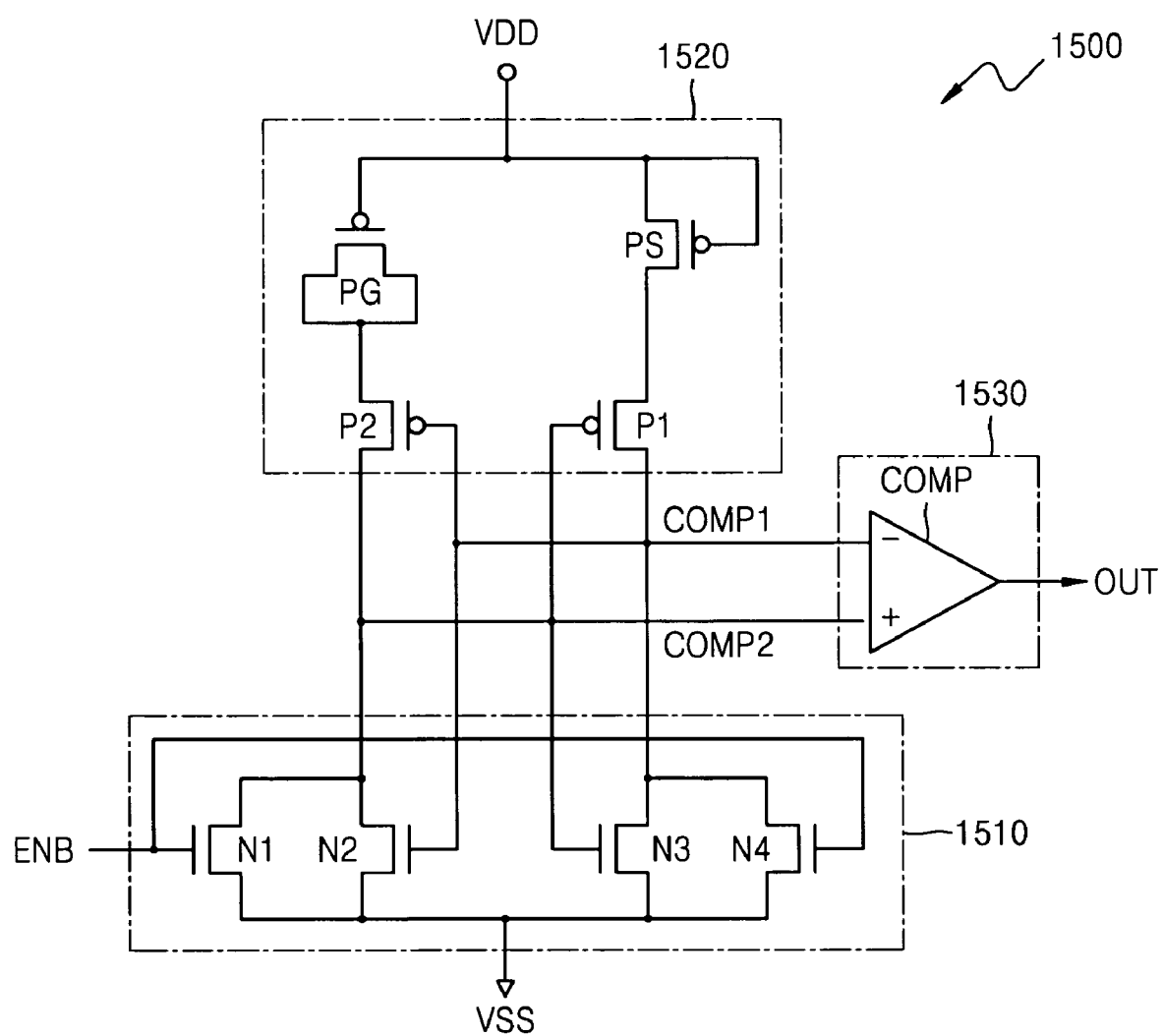
FIG. 15 illustrates the leakage current comparison circuit of FIG. 13 according to an embodiment of the present invention.

Circuits of FIGS. 14 and 15 that embody the leakage current comparison circuit of FIG. 13 use sense amplifiers. The circuit of FIG. 14 relates to leakage charges penetrating a substrate and gate insulating layer of an N-type MOS transistor and the circuit of FIG. 15 relates to leakage charges penetrating a substrate and gate insulating layer of a P-type MOS transistor.

FIG. 14 illustrates the leakage current comparison circuit of FIG. 13 according to an embodiment of the present invention. Referring to FIG. 14, the leakage current comparison circuit 1400 includes a charge supply 1410, a leakage current comparator 1420 and a detection signal generator 1430.

The charge supply 1410 includes first, second, third and fourth P-type MOS transistors P1, P2, P3 and P4. The first P-type MOS transistor P1 has a source coupled to the first power supply voltage VDD, a drain coupled to a first comparative signal terminal COMP1, and a gate receiving the enable signal EN. The second P-type MOS transistor P2 has a source coupled to the first power supply voltage VDD, a drain coupled to the first comparative signal terminal COMP1, and a gate receiving the second comparative signal COMP2. The third P-type MOS transistor P3 has a source coupled to the first power supply voltage VDD, a drain coupled to the second comparative signal terminal COMP2, and a gate receiving the first comparative signal COMP1. The fourth P-type MOS transistor P4 has a source coupled to the first power supply voltage VDD, a drain coupled to the second comparative signal terminal COMP2, and a gate receiving the enable signal EN.

The leakage current comparator 1420 includes a first N-type MOS transistor N1, an N-type MOS transistor NS for substrate leakage, a second N-type MOS transistor N2, an N-type MOS transistor NG for gate leakage. The first N-type MOS transistor N1 has a drain coupled to the first comparative signal terminal COMP1 and a gate receiving the second comparative signal COMP2. The N-type MOS transistor NS for substrate leakage has a drain coupled to the source of the first N-type MOS transistor N1, a source and a gate coupled to the second power supply voltage VSS. The second N-type MOS transistor N2 has a drain coupled to the second comparative signal terminal COMP2 and a gate receiving the first comparative signal COMP1. The N-type MOS transistor NG for gate leakage has a drain and a source coupled to the second power supply voltage VSS, and a gate coupled to the source of the second N-type MOS transistor.

The detection signal generator 1430 includes a comparator COMP outputting a signal OUT representing the result of comparison of the first and second comparative signals COMP1 and COMP2.

The operation of the leakage current comparison circuit 1400 shown in FIG. 14 will now be explained.

A current flowing through the N-type MOS transistor NS for substrate leakage has only a leakage current component caused by leakage charges penetrating the substrate thereof because the gate of the N-type MOS transistor NS for substrate leakage is coupled to the second power supply voltage to turn off the N-type MOS transistor NS for substrate leakage. A current flowing through the N-type MOS transistor NG for gate leakage, having a DC path blocked due to the gate insulating layer thereof, has only a leakage current component caused by leakage charges penetrating the gate insulating layer.

When the first P-type MOS transistor P1 and the fourth P-type MOS transistor P4 are turned on by the enable signal EN, current paths through which charges can be respectively supplied to the first N-type MOS transistor N1 and the second N-type MOS transistor N are formed. The voltage levels of the first and second comparative signals COMP1 and COMP2 are varied with the quantity of current flowing through the N-type MOS transistor NS for substrate leakage and the quantity of current flowing through the N-type MOS transistor NG for gate leakage.

When the quantity of current flowing through the N-type MOS transistor NS for substrate leakage is larger than the quantity of current flowing through the N-type MOS transistor NG for gate leakage, the voltage level of the first comparative signal COMP1 becomes lower than the voltage level of the second comparative signal COMP2. Thus, the output signal OUT of the comparator COMP becomes a logic high state. On the contrary, when the quantity of current flowing through the N-type MOS transistor NS for substrate leakage is smaller than the quantity of current flowing through the N-type MOS transistor NG for gate leakage, the voltage level of the first comparative signal COMP1 becomes higher than the voltage level of the second comparative signal COMP2, and thus the output signal OUT of the comparator COMP becomes a logic low state.

Accordingly, it can be judged which one of the substrate leakage current and gate leakage current is larger than the other in response to the logic state of the output signal OUT of the comparator COMP.

While it is not shown in FIG. 14, the drain and source of the N-type MOS transistor NG for gate leakage can be coupled to the source of the second N-type MOS transistor N2 and the gate thereof can be coupled to the second power supply voltage VSS.

FIG. 15 illustrates the leakage current comparison circuit of FIG. 13 according to an embodiment of the present invention. Referring to FIG. 15, the leakage current comparison circuit 1500 includes a charge supply 1510, a leakage current comparator 1520 and a detection signal generator 1530.

The charge supply 1510 includes first, second, third and fourth N-type MOS transistors N1, N2, N3 and N4. The first N-type MOS transistor N1 has a source coupled to the second power supply voltage VSS, a drain coupled to the second comparative signal terminal COMP2, and a gate receiving the reverse enable signal ENB. The second N-type MOS transistor N2 has a source coupled to the second power supply voltage VSS, a drain coupled to the second comparative signal terminal COMP2, and a gate receiving the first comparative signal COMP1. The third N-type MOS transistor N3 has a source coupled to the second power supply voltage VSS, a drain coupled to the first comparative signal terminal COMP1, and a gate receiving the second comparative signal COMP2. The fourth N-type MOS transistor N4 has a source coupled to the second power supply voltage VSS, a drain coupled to the first comparative signal terminal COMP1, and a gate receiving the reverse enable signal ENB.

The leakage current comparator 1520 includes a first P-type MOS transistor P1, a P-type MOS transistor PS for substrate leakage, a second P-type MOS transistor P2, and a P-type MOS transistor PG for gate leakage. The first P-type MOS transistor P1 has a drain coupled to the first comparative signal terminal COMP1 and a gate receiving the second comparative signal COMP2. The P-type MOS transistor PS for substrate leakage has a drain coupled to the source of the first P-type MOS transistor P1, a source and a gate coupled to the first power supply voltage VDD. The second P-type MOS transistor P2 has a drain coupled to the second comparative signal terminal COMP2 and a gate receiving the first comparative signal COMP1. The P-type MOS transistor PG for gate leakage has a drain and a source coupled to the source of the second P-type MOS transistor P2, and a gate coupled to the first power supply voltage VDD.

While it is not shown in FIG. 15, the drain and source of the P-type MOS transistor PG for gate leakage can be coupled to the first power supply voltage VDD and the gate thereof can be coupled to the source of the second P-type MOS transistor P2.

The detection signal generator 1530 includes a comparator COMP outputting a signal OUT representing the result of comparison of the first and second comparative signals COMP1 and COMP2.

As described above, the leakage current measurement circuit and leakage current comparison circuit according to an embodiment of the present invention can detect the quantity of leakage current caused by charges leaking through the substrates and gate insulating layers of MOS transistors and judge which one of the substrate leakage current and gate leakage current is the larger.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A leakage current measurement circuit comprising:
   a charge supply transferring charges supplied from a first power supply voltage or a second power supply voltage in response to an enable signal or to a reverse enable signal having a phase opposite to a phase of the enable signal; and
   a leakage current generator making the charges transferred from the charge supply flow to the first power supply voltage or the second power supply voltage, the first power supply voltage being higher than the second power supply voltage,
   wherein the leakage current generator includes:
   a substrate leakage current generating circuit located between the first power supply voltage and the charge supply or between the second power supply voltage and the charge supply to generate a substrate leakage current; and
   a gate leakage current generating circuit located between the first power supply voltage and the charge supply or between the second power supply voltage and the charge supply to generate a gate leakage current,
   wherein the charge supply receives charges from the first power supply voltage or the second power supply voltage in response to the enable signal or to the reverse enable signal, and preserves previously received charges when it cannot receive charges from the first power supply voltage or the second power supply voltage any more.

2. The leakage current measurement circuit of claim 1, wherein the charge supply includes an MOS transistor for supplying charges, the MOS transistor having a drain, a source, and a gate receiving the enable signal or the reverse enable signal, one of the drain and source of the MOS transistor being coupled to the first power supply voltage or the second power supply voltage and the other being coupled to the leakage current generator.

3. The leakage current measurement circuit of claim 2, wherein the MOS transistor for supplying charges is a P-type MOS transistor having a source coupled to the first power supply voltage, a drain coupled to the leakage current generator, and a gate receiving the enable signal.

4. The leakage current measurement circuit of claim 2, wherein the MOS transistor for supplying charges is an N-type MOS transistor having a source coupled to the second power supply voltage, a drain coupled to the leakage current generator, and a gate receiving the reverse enable signal.

5. The leakage current measurement circuit of claim 1, wherein the substrate leakage current generating circuit includes an MOS transistor for generating the substrate leakage current, which has a drain, a source, and a gate receiving the first power supply voltage or the second power supply voltage, one of the drain and source of the MOS transistor being coupled to the charge supply and the other being coupled to the first power supply voltage or the second power supply voltage.

6. The leakage current measurement circuit of claim 5, wherein the MOS transistor for generating the substrate leakage current is an N-type MOS transistor having a drain coupled to the charge supply, a source coupled to the second power supply voltage, and a gate receiving the second power supply voltage.

7. The leakage current measurement circuit of claim 5, wherein the MOS transistor for generating the substrate leakage current is a P-type MOS transistor having a drain coupled to the charge supply, a source coupled to the first power supply voltage, and a gate receiving the first power supply voltage.

8. The leakage current measurement circuit of claim 1, wherein the gate leakage current generating circuit includes an MOS transistor for generating the gate leakage current, which has a drain and a source coupled to one of the charge supply, the first power supply voltage and the second power supply voltage, and a gate coupled to one of the charge supply, the first power supply voltage and the second power supply voltage.

9. The leakage current measurement circuit of claim 8, wherein the MOS transistor for generating the gate leakage current is an N-type MOS transistor having a drain and a source coupled to the second power supply voltage, and a gate coupled to the charge supply.

10. The leakage current measurement circuit of claim 8, wherein the MOS transistor for generating the gate leakage current is an N-type MOS transistor having a drain and a source coupled to the charge supply, and a gate coupled to the second power supply voltage.

11. The leakage current measurement circuit of claim 8, wherein the MOS transistor for generating the gate leakage current is a P-type MOS transistor having a drain and a source coupled to the first power supply voltage, and a gate coupled to the charge supply.

12. The leakage current measurement circuit of claim 8, wherein the MOS transistor for generating the gate leakage current is a P-type MOS transistor having a drain and a source coupled to the charge supply, and a gate coupled to the first power supply voltage.

13. The leakage current measurement circuit of claim 1, further comprising a detection signal generator connected to the charge supply and leakage current generator and outputting a detection signal corresponding to the quantity of charges flowing from the charge supply to the leakage current generator.

14. The leakage current measurement circuit of claim 13, wherein the detection signal generator has an inverter having an input terminal coupled to a common terminal of the charge supply and the leakage current generator and an output terminal outputting the detection signal.

* * * * *